United States Patent [19]

Ota

[11] Patent Number: 6,018,538
[45] Date of Patent: Jan. 25, 2000

[54] HIGH SPEED NON-BIASED SEMICONDUCTOR LASER DIONE DRIVER FOR HIGH SPEED DIGITAL COMMUNICATION

[75] Inventor: Yusuke Ota, Mountain Lakes, N.J.

[73] Assignee: Lucent Technologies Inc., Murray Hill, N.J.

[21] Appl. No.: 08/877,910

[22] Filed: Jun. 18, 1997

[51] Int. Cl.$^7$ .................................................. H01S 3/00

[52] U.S. Cl. ............................................................ 372/38

[58] Field of Search .......................... 372/38; 174/5 SG, 174/6, 7; 307/135; 257/125

[56] References Cited

U.S. PATENT DOCUMENTS

| | | | |
|---|---|---|---|
| 4,924,473 | 5/1990 | Burgyan et al. | 372/38 |
| 5,140,175 | 8/1992 | Yagi et al. | 372/38 |
| 5,349,595 | 9/1994 | Ozawa et al. | 372/38 |
| 5,513,197 | 4/1996 | Koishi | 372/38 |
| 5,598,040 | 1/1997 | Markis | 372/38 |
| 5,602,665 | 2/1997 | Asako | 372/38 |
| 5,631,917 | 5/1997 | Ogawa | 372/38 |
| 5,651,017 | 7/1997 | Genovese | 372/38 |
| 5,675,599 | 10/1997 | Abe et al. | 372/38 |

FOREIGN PATENT DOCUMENTS 0 312 143  4/1989  European Pat. Off. .
37 11 051  10/1987  Germany .

OTHER PUBLICATIONS

European Search Report No. EP 98 30 4537, Sep. 25, 1998—European Patent Office—The Hague.

Wedding, B: "Reduction of Bit Error Rate in High Speed Optical Transmission Systems Due to Optimized Electrical Drive Pulse Shaping"—European Conference on Optical Communication, Sep. 11–15, 1998, vol. Part 1, No. Conf. 14. Sep. 11, 1998, pp. 187–190, XP000145107—Institution of Electrical Engineer, p. 187, line 5–line 34; figure 1B.

Uenohara, H.: Kawamura, Y; Iwamura, H: "Long–Wavelength Multiple–Quantum–Well Voltage–Controlled Bistable Laser Diodes"—IEEE Journal of Quantum Electronics, Dec. 31, 1995, No. 12, New York, pp. 2142–2147.

Howard, L. and Daneshvar, K: "Nonosecond–Pulse Generator For Laser Diodes"—Review of Scientific Instruments 60, No. 10, New York, Oct. 1989, pp. 3343–3345.

Primary Examiner—James W. Davie
Assistant Examiner—Robert E. Wise
Attorney, Agent, or Firm—Eugene J. Rosenthal

[57] ABSTRACT

The length of the tail which results in an optical output from a laser diode after the laser diode is no longer being driven is reduced or eliminated by a laser diode driver with a tail eliminator. More specifically, the laser diode driver includes an energy drainage path that is activated when packet communication is over. In one embodiment of invention, the terminals of the laser diode are short-circuited to provide the energy drainage path. In another embodiment of the invention, the laser diode is reverse biased, so that charges stored in the laser diode are combined with charges which are provided thereto. Advantageously, the tail emission is substantially eliminated.

12 Claims, 2 Drawing Sheets

HIGH SPEED NON-BIASED SEMICONDUCTOR LASER DIONE DRIVER FOR HIGH SPEED DIGITAL COMMUNICATION

TECHNICAL FIELD

This invention relates to optical communication, and more particularly, to a circuit for driving a semiconductor laser diode used in an optical communications link.

BACKGROUND OF THE INVENTION

In prior art high speed passive optical networks (H-PON), no DC optical signal is allowed in the upstream from the optical network unit (ONU) on the customer premises to the optical line terminal (OLT) located in the central office. This requires a semiconductor laser diode at the ONU to be operated without bias.

However, when a semiconductor laser diode is operated without bias in the prior art, the optical output does not turn off immediately after the driving signal is turned off. That is, a tail is observed in the optical output. Such a situation is illustrated in FIG. 1.

The tail emission is caused by 1) electrical charge that is stored in the laser diode while it is being driven and 2) the fact that the process of recombination of the charges in the laser diode is a slow one even after the driving current is removed.

Conventionally, the tail extends over 100 ns. However, in the H-PON, which is a time shared system in which multiple customer premises ONUs transmit their data in sequence in their designated time slots, the signal packets from the different customer premises ONUs often wind up being spaced much closer together than the length of the tail. This implies that a packet from a particular customer premises ONU is influenced by the tail that was generated by the customer premises ONU which was transmitting a packet in the time slot immediately precedent to that of the particular customer premises ONU.

SUMMARY OF THE INVENTION

I have recognized that it is important to reduce the tail length or to eliminate the tail altogether. In accordance with the principles of the invention, this is achieved by a laser diode driver with a tail eliminator. More specifically, the laser diode driver includes an energy drainage path that is activated when packet communication is over. In one embodiment of invention, the terminals of the laser diode are short-circuited to provide the energy drainage path. In another embodiment of the invention, the laser diode is reverse biased, so that charges stored in the laser diode are combined with charges which are provided thereto. Advantageously, the tail emission is substantially eliminated.

DETAILED DESCRIPTION

Figure 1:
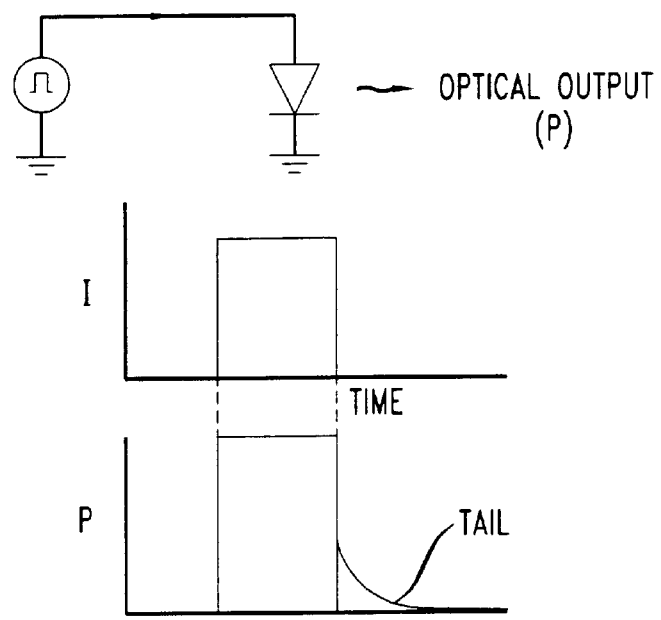
FIG. 1 shows an example of a tail that results when a semiconductor laser diode is operated without bias in the prior art, because the optical output does not turn off immediately after the driving signal is turned off.
Figure 2:
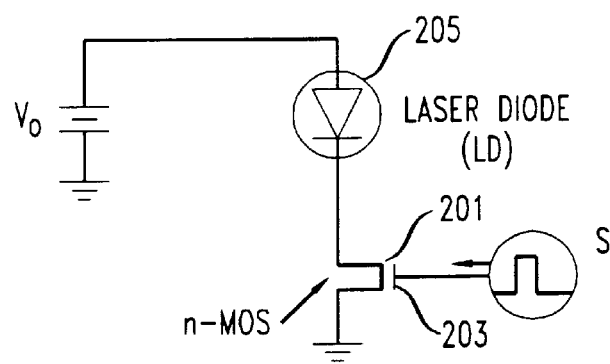
FIG. 2 shows a simple prior art arrangement for driving a laser diode without bias.

FIG. 2 shows a simple prior art arrangement for driving laser diode (LD) 205 without bias. n-MOS 201 transistor operates as a switch. When the signal to gate 203 is high, n-MOS transistor 201 becomes conductive and a current passes through laser diode 205, causing emission of a laser beam. However, when n-MOS transistor 201 is turned off, by having the signal to gate 203 (S) be low, the stored energy in laser diode 205 has no path to drain out. Therefore, this stored energy is slowly discharged within the laser diode, and it is this slow discharge that causes the prior art tail.

Figure 3:
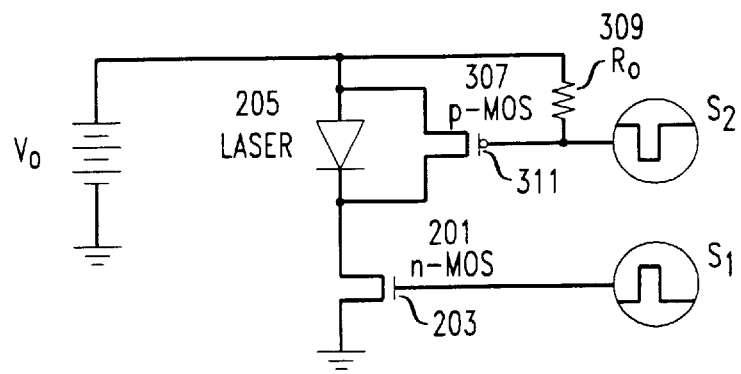
FIG. 3 shows an exemplary arrangement for driving a laser diode but having an energy drainage path in accordance with the principles of the invention.
Figure 3:
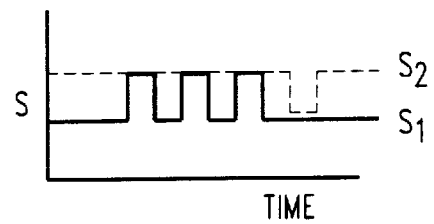

To alleviate this problem, the circuit shown in FIG. 3 adds an energy drainage path in accordance with the principles of the invention. Underlying the circuit of FIG. 3 is the circuit of FIG. 2. However, p-MOS transistor 307 and pull-up resistor 309 have been added to the circuit.

In the circuit of FIG. 3, gate 311 of p-MOS transistor 307 is normally set high by pull-up resistor 303. This results in p-MOS transistor 307 being in the off state. As before, laser diode 205 is activated when n-MOS transistor 201 is turned on by gate signal S being high. When the packet communication is over, e.g., in response to a change in the transmit packet signal already available in the H-PON system, a pulse of "LOW" is applied to gate 311 of p-MOS transistor 307. This pulse makes p-MOS transistor 307 conductive i.e., in the on-state. At the same time, n-MOS transistor 201 is in the off-state. Therefore, the terminals of laser diode 205 are short-circuited together and an energy drainage path for the laser diode is formed. Advantageously, the length of the laser emission tail is shortened.

Figure 4:
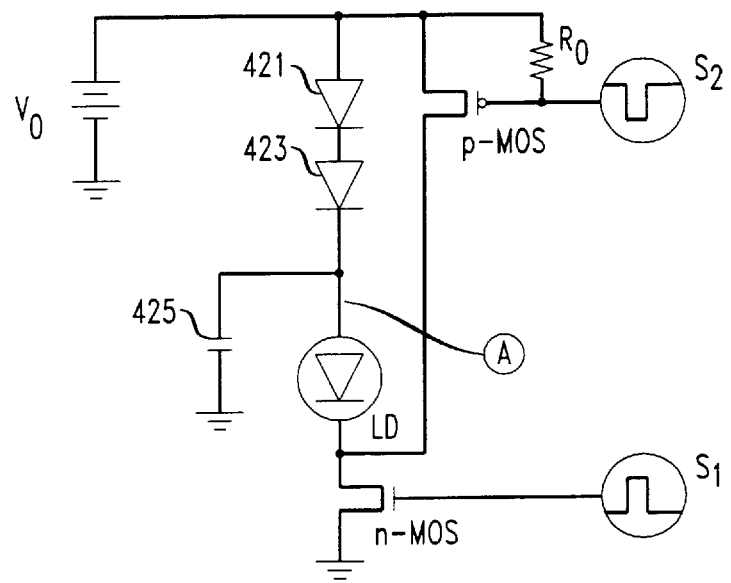
FIG. 4 shows another embodiment of the invention that further accelerates the energy drainage process of the laser diode, albeit at the cost of additional components.

FIG. 4 shows another embodiment of the invention that further accelerates the energy drainage process, albeit at the cost of additional components. More specifically, diodes 421 and 423, as well as capacitor 425 are added to the circuit shown in FIG. 3. Diodes 421 and 423 are high current rectifier diodes. When signal S1 is high, current passes through diodes 421 and 423, laser diode (LD) 201, and n-MOS transistor 201. The potential at point A is $V_0-2V_{th}$, where $V_{th}$ is the forward threshold of diodes 421 and 423. Usually, $V_{th}$ is about 0.7V in a Si rectifier diode. This potential $V_0-2V_{th}$ is stored in capacitor 425. When the packet signal S1 is completed, n-MOS transistor 201 is turned off and p-MOS transistor 307 is turned on, by bringing the signal S2 at gate 311 thereof low, laser diode 205 is back-biased by $2V_{th}$, and reverse current is supplied from capacitor 425 and voltage source $V_0$. In this way, laser diode 205 is completely shut-off and its internal active charges are swiftly eliminated, because they recombine with charges supplied by capacitor 425. Advantageously this circuit substantially eliminates the tail emission.

Note that the use of two diodes is simply an exemplary way of achieving a voltage drop so that a reverse bias effect results at the laser diode. However, any technique of achieving a voltage drop may be employed, including, but not limited to a resistor, a zener diode, or the like. Those of ordinary skill in the art will recognize that, given the laser diode operating characteristics and the power supply voltage, the components for achieving the voltage drop should be selected, preferably, to yield the greatest voltage drop achievable while consuming the least current in the laser diode active state.

As the use of n-MOS and p-MOS transistors are strictly exemplary, those of ordinary skill in the art will readily recognize how to change the types of transistors employed. Furthermore, those of ordinary skill in the art will recognize that it is not necessary to employ opposite types of transistors to implement the invention, but instead, the invention may be implemented using a single type of transistor.

For pedagogical purposes, note that because of thesholding in reading the signal values, the tails that are generated after each one to zero transition by a single ONU are easily ignored, because the tail power, although a function of the particular laser diode, is typically no more than 10% of the laser diode output power. However, because the laser diode output power between different ONUs is permitted to vary by a very large amount, e.g., the maximum power may be up to 1000 times greater than the minimum power, the tail from a laser diode which was generating the maximum power will easily dwarf the signal from the laser diode of the next ONU which is generating only the minimum power. In other words, without the invention, transmission errors would develop if the tail generated by the laser diode of one ONU was too big with respect to the signal generated by the laser diode of the next ONU. In fact, a small signal could be completely "buried" by a large tail.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. Apparatus for use with a semiconductor laser diode, comprising:

a semiconductor laser diode driving circuit for controllably driving said semiconductor laser diode; and means for eliminating excess charges stored in said semiconductor laser diode when it is not being driven by said semiconductor laser diode driving circuit wherein said means for eliminating excess charges stored in said semiconductor laser diode reverse biases said semiconductor laser diode.

2. The invention as defined in claim 1 wherein said semiconductor laser diode driving circuit comprises a first MOS transistor and said means for eliminating excess charges comprises a second MOS transistor.

3. The invention as defined in claim 1 wherein said semiconductor laser diode driving circuit comprises an MOS transistor of a first type and said means for eliminating excess charges comprises an MOS transistor of a second type opposite to said first type.

4. The invention as defined in claim 1 wherein said means for eliminating excess charges stored in said semiconductor laser diode includes means for supplying charges to recombine with charges stored in said semiconductor laser diode.

5. Apparatus for use with a semiconductor laser diode, comprising:

a semiconductor laser diode driving circuit for controllably driving said semiconductor laser diode; and means for reverse biasing said semiconductor laser diode when it is not being driven by said semiconductor laser diode driving circuit.

6. The invention as defined in 5 wherein said means for reverse biasing said semiconductor laser diode includes a capacitor coupled to said semiconductor laser diode, whereby charges stored in said capacitor combine with charges stored in said semiconductor laser diode so as to extinguish illumination of said semiconductor laser diode.

7. The invention as defined in 5 wherein said means for reverse biasing said semiconductor laser diode includes means for generating a voltage drop.

8. The invention as defined in claim 7 wherein said means for generating a voltage drop includes a diode.

9. The invention as defined in claim 7 wherein said means for generating a voltage drop includes a resistor.

10. A method for operating a semiconductor laser diode, comprising the steps of:

driving said semiconductor laser diode to supply information encoded as optical signals; and reverse biasing said semiconductor laser diode upon conclusion of said driving step.

11. The invention as defined in claim 10 wherein said information is arranged into periodic groups, and further wherein said reverse biasing step is performed upon conclusion of each of said periodic groups.

12. A method for operating a semiconductor laser diode, comprising the steps of:

driving said semiconductor laser diode to supply information encoded as optical signals; and reverse biasing said semiconductor laser diode upon conclusion of said driving step wherein said information is arranged into periodic groups, and further wherein said substantially short circuiting step is performed upon conclusion of each of said periodic groups.

* * * * *